US011545379B2

(12) United States Patent
Chou

(10) Patent No.: US 11,545,379 B2
(45) Date of Patent: Jan. 3, 2023

(54) SYSTEM AND METHOD FOR CONTROLLING SEMICONDUCTOR MANUFACTURING EQUIPMENT

(71) Applicant: NANYA TECHNOLOGY CORPORATION, New Taipei (TW)

(72) Inventor: Sun-Fu Chou, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 57 days.

(21) Appl. No.: 16/945,079

(22) Filed: Jul. 31, 2020

(65) Prior Publication Data

US 2022/0037180 A1 Feb. 3, 2022

(51) Int. Cl.
*H01L 21/673* (2006.01)
*G01M 3/32* (2006.01)
*G06N 5/04* (2006.01)
*G08B 21/18* (2006.01)
*G06N 20/00* (2019.01)
*G08B 31/00* (2006.01)

(52) U.S. Cl.
CPC ..... *H01L 21/67389* (2013.01); *G01M 3/3236* (2013.01); *G06N 5/04* (2013.01); *G06N 20/00* (2019.01); *G08B 21/182* (2013.01); *G08B 31/00* (2013.01)

(58) Field of Classification Search
CPC . H01L 21/67389; G01M 3/3236; G06N 5/04; G06N 20/00; G08B 21/182; G08B 31/00
See application file for complete search history.

(56) References Cited

U.S. PATENT DOCUMENTS

| 7,020,535 B1 * | 3/2006 | Bode | G05B 19/41875 |
| | | | 700/110 |
| 9,875,921 B2 * | 1/2018 | Bachlechner | H01L 21/67769 |
| 2001/0020199 A1 * | 9/2001 | Bacchi | B25J 9/042 |
| | | | 700/247 |
| 2002/0178568 A1 * | 12/2002 | Ohori | H01L 21/67373 |
| | | | 206/454 |

(Continued)

FOREIGN PATENT DOCUMENTS

JP H10107111 A * 9/1996

*Primary Examiner* — Joseph H Feild
*Assistant Examiner* — Rufus C Point
(74) *Attorney, Agent, or Firm* — Muncy, Geissler, Olds & Lowe, P.C.

(57) ABSTRACT

The present disclosure provides systems and methods for controlling a semiconductor manufacturing equipment. A control system includes a sensor unit capturing a set of data related to a gas pressure in the equipment, a sensor interface receiving the set of data and generating at least one input signal for a database server, and a control unit. The control unit includes a front end subsystem, a calculation subsystem, and a message and feedback subsystem. The front end subsystem performs a front end process to generate a data signal. The calculation subsystem performs an artificial intelligence analytical process to determine, according to the data signal, whether a malfunction related to the gas pressure has occurred and generate an output signal. The message and feedback subsystem generates an alert signal and a feedback signal according to the output signal and transmits the alert signal to a user.

17 Claims, 20 Drawing Sheets

(56) References Cited

U.S. PATENT DOCUMENTS

| | | | |
|---|---|---|---|
| 2003/0044261 A1* | 3/2003 | Bonora | H01L 21/67775 414/217 |
| 2005/0030511 A1* | 2/2005 | Auer-Jongepier | G03F 7/7075 355/72 |
| 2005/0137751 A1* | 6/2005 | Cox | H01L 21/67259 700/254 |
| 2005/0288898 A1* | 12/2005 | Le | G05B 23/0221 702/183 |
| 2006/0207314 A1* | 9/2006 | Kitazawa | G01M 3/3236 73/49.2 |
| 2007/0043534 A1* | 2/2007 | Arruda | G01M 3/3236 702/183 |
| 2007/0239375 A1* | 10/2007 | Kaushal | G05B 23/0254 702/33 |
| 2007/0250461 A1* | 10/2007 | Sabe | G06N 20/00 706/12 |
| 2008/0107506 A1* | 5/2008 | Babbs | H01L 21/67393 414/217 |
| 2009/0053017 A1* | 2/2009 | Shmuelov | H01L 21/67393 414/217 |
| 2009/0263216 A1* | 10/2009 | Favre | H01L 21/67017 414/222.02 |
| 2011/0071661 A1* | 3/2011 | Asai | G05B 19/41875 700/110 |
| 2012/0317058 A1* | 12/2012 | Abhulimen | G06N 20/00 706/2 |
| 2013/0247937 A1* | 9/2013 | Nunomura | H01L 21/67745 156/345.24 |
| 2014/0202921 A1* | 7/2014 | Babbs | H01L 21/67201 206/710 |
| 2016/0118279 A1* | 4/2016 | Iyer | H01L 21/67772 118/715 |
| 2016/0329225 A1* | 11/2016 | Bachlechner | H01L 21/67769 |
| 2016/0329226 A1 | 11/2016 | Bachiechner et al. | |
| 2016/0370797 A1* | 12/2016 | Azarya | H01L 21/67253 |
| 2017/0221743 A1* | 8/2017 | Kondoh | H01L 21/67389 |
| 2018/0040460 A1* | 2/2018 | Gottscho | H01J 37/32853 |
| 2019/0324439 A1* | 10/2019 | Celia | G05B 19/41865 |
| 2019/0362995 A1* | 11/2019 | Ito | G06K 7/10366 |
| 2019/0378734 A1* | 12/2019 | Ehrne | H01L 21/67259 |
| 2020/0194292 A1* | 6/2020 | Ito | H01L 21/67775 |
| 2020/0225655 A1* | 7/2020 | Cella | G05B 23/024 |

* cited by examiner

SYSTEM AND METHOD FOR CONTROLLING SEMICONDUCTOR MANUFACTURING EQUIPMENT

TECHNICAL FIELD

The present disclosure relates to a system and a method for controlling an equipment, and more particularly, to a system and a method for controlling a semiconductor manufacturing equipment.

DISCUSSION OF THE BACKGROUND

The improvement of integration density has led to the rapid growth of the semiconductor industry. In many fabrication tools, semiconductor manufacturing equipment such as the front opening unified pod (FOUP) form an indispensable part of the fabrication process. A malfunction of the FOUPs related to the gas pressure of a purge gas inside these FOUPs is often discovered after a large quantity of wafers have already been contaminated and scrapped. Human inspection and monitoring of the seal leaks in the FOUPs often result in lost processing time and defective products due to human error. Accordingly, systems and methods for controlling and monitoring the status of the FOUPs need to be effective in identifying leaking equipment, as well as providing advanced warnings of various equipment parameters.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a control system of a semiconductor manufacturing equipment, comprising a sensor unit capturing a set of data related to a gas pressure in the semiconductor manufacturing equipment, a sensor interface receiving the set of data and generating at least one input signal for a database server, and a control unit. The control unit comprises a front end subsystem, a calculation subsystem, and a message and feedback subsystem. The front end subsystem receives the at least one input signal from the database server and performs a front end process to generate a data signal. The calculation subsystem receives the data signal from the front end subsystem, wherein the calculation subsystem performs an artificial intelligence (AI) analytical process to determine, according to the data signal, whether a malfunction related to the gas pressure has occurred in the semiconductor manufacturing equipment and generate an output signal. The message and feedback subsystem generates an alert signal and a feedback signal according to the output signal, the message and feedback subsystem transmitting the alert signal to a user of the semiconductor manufacturing equipment.

In some embodiments, the AI analytical process performed by the calculation subsystem compares the set of data related to the gas pressure in the data signal to a threshold level to determine whether the malfunction has occurred in the semiconductor manufacturing equipment.

In some embodiments, the AI analytical process performed by the calculation subsystem further utilizes a pressure tracking algorithm to monitor the gas pressure in the semiconductor manufacturing equipment and determine whether a seal is maintained.

In some embodiments, the AI analytical process performed by the calculation subsystem utilizes a statistical prediction model corresponding to the data signal to predict a failure and contamination time of the semiconductor manufacturing equipment.

In some embodiments, the front end process performed by the front end subsystem comprises extracting, transforming, and/or loading the input signal from the database server, and the message and feedback subsystem transmits the feedback signal for an automated feedback process of the semiconductor manufacturing equipment according to the output signal.

In some embodiments, the semiconductor manufacturing equipment comprises at least one front opening unified pod (FOUP), and the sensor unit comprises at least one pressure detector disposed in the FOUP.

In some embodiments, the semiconductor manufacturing equipment comprises at least one front opening unified pod (FOUP), and the sensor unit comprises at least one blocking device disposed at a gas outlet of the FOUP, wherein a measurable force is applied to the blocking device.

Another aspect of the present disclosure provides a control system of a semiconductor manufacturing equipment comprising a sensor unit capturing a set of data related to a gas pressure in the semiconductor manufacturing equipment, a sensor interface receiving the set of data and generating at least one input signal for a database server, one or more processors, and one or more computer-readable non-transitory storage media. The one or more computer-readable non-transitory storage media is coupled to the one or more processors and includes instructions operable when executed by the one or more processors to cause the control system to: receive the at least one input signal from the database server and perform a front end process to generate a data signal; perform an artificial intelligence (AI) analytical process to determine, according to the data signal, whether a malfunction related to the gas pressure has occurred in the semiconductor manufacturing equipment and generate an output signal; and generate an alert signal and a feedback signal according to the output signal, and transmit the alert signal to a user of the semiconductor manufacturing equipment.

In some embodiments, the one or more computer-readable non-transitory storage media further comprising instructions operable when executed by the one or more processors to cause the control system to perform the AI analytical process by comparing the set of data related to the gas pressure in the data signal to a threshold level to determine whether the malfunction has occurred in the semiconductor manufacturing equipment.

In some embodiments, the one or more computer-readable non-transitory storage media further comprising instructions operable when executed by the one or more processors to cause the control system to perform the AI analytical process by further utilizing a pressure tracking algorithm to monitor the gas pressure in the semiconductor manufacturing equipment and determine whether a seal is maintained.

In some embodiments, the one or more computer-readable non-transitory storage media further comprising instructions operable when executed by the one or more processors to cause the control system to perform the AI analytical process by utilizing a statistical prediction model corresponding to the data signal to predict a failure and contamination time of the semiconductor manufacturing equipment.

In some embodiments, the front end process comprises extracting, transforming, and/or loading the input signal from the database server, and the one or more computer-readable non-transitory storage media further comprising instructions operable when executed by the one or more processors to cause the control system to transmit the feedback signal for an automated feedback process of the semiconductor manufacturing equipment according to the output signal.

In some embodiments, the semiconductor manufacturing equipment comprises at least one front opening unified pod (FOUP), and the sensor unit comprises at least one pressure detector disposed in the FOUP.

In some embodiments, the semiconductor manufacturing equipment comprises at least one front opening unified pod (FOUP), and the sensor unit comprises at least one blocking device disposed at a gas outlet of the FOUP, wherein a measurable force is applied to the blocking device.

Another aspect of the present disclosure provides a method for controlling a semiconductor manufacturing equipment comprising: capturing, by a sensor unit, a set of data related to a gas pressure in the semiconductor manufacturing equipment; receiving, by a sensor interface, the set of data and generating at least one input signal for a database server; receiving, by a front end subsystem, the at least one input signal from the database server and performing a front end process to generate a data signal; receiving, by a calculation subsystem, the data signal from the front end subsystem, the calculation subsystem performing an artificial intelligence (AI) analytical process to determine, according to the data signal, whether a malfunction related to the gas pressure has occurred in the semiconductor manufacturing equipment and generate an output signal; and generating, by a message and feedback subsystem, an alert signal and a feedback signal according to the output signal, the message and feedback subsystem transmitting the alert signal to a user of the semiconductor manufacturing equipment.

In some embodiments, the AI analytical process performed by the calculation subsystem further comprises comparing the set of data related to the gas pressure in the data signal to a threshold level to determine whether the malfunction has occurred in the semiconductor manufacturing equipment, and utilizing a pressure tracking algorithm to monitor the gas pressure in the semiconductor manufacturing equipment and determine whether a seal is maintained.

In some embodiments, the AI analytical process performed by the calculation subsystem further comprising utilizing a statistical prediction model corresponding to the data signal to predict a failure and contamination time of the semiconductor manufacturing equipment.

In some embodiments, the front end process performed by the front end subsystem further comprises extracting, transforming, and/or loading the input signal from the database server, the method further comprising transmitting, by the message and feedback subsystem, the feedback signal for an automated feedback process of the semiconductor manufacturing equipment according to the output signal.

In some embodiments, the semiconductor manufacturing equipment comprises at least one front opening unified pod (FOUP), and the sensor unit comprises at least one pressure detector disposed in the FOUP.

In some embodiments, the semiconductor manufacturing equipment comprises at least one front opening unified pod (FOUP), and the sensor unit comprises at least one blocking device disposed at a gas outlet of the FOUP, wherein a measurable force is applied to the blocking device.

Accordingly, the control systems and methods for controlling the semiconductor manufacturing equipment in the present disclosure provide automated AI subsystems and processes capable of analyzing the gas pressure in equipment such as the FOUP, where seal leaks may lead to airborne molecular contamination of the wafers. Due to the control unit including the intelligent calculation subsystem 51 and the message and feedback subsystem 52, operators of the FOUP can monitor and optimize the gas pressure related parameters and receive advanced warnings regarding malfunctioning equipment. Moreover, due to the automated equipment feedback of the control systems and the methods, human judgment error, processing times, and production yield loss can be minimized.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

DETAILED DESCRIPTION

Figure 1:
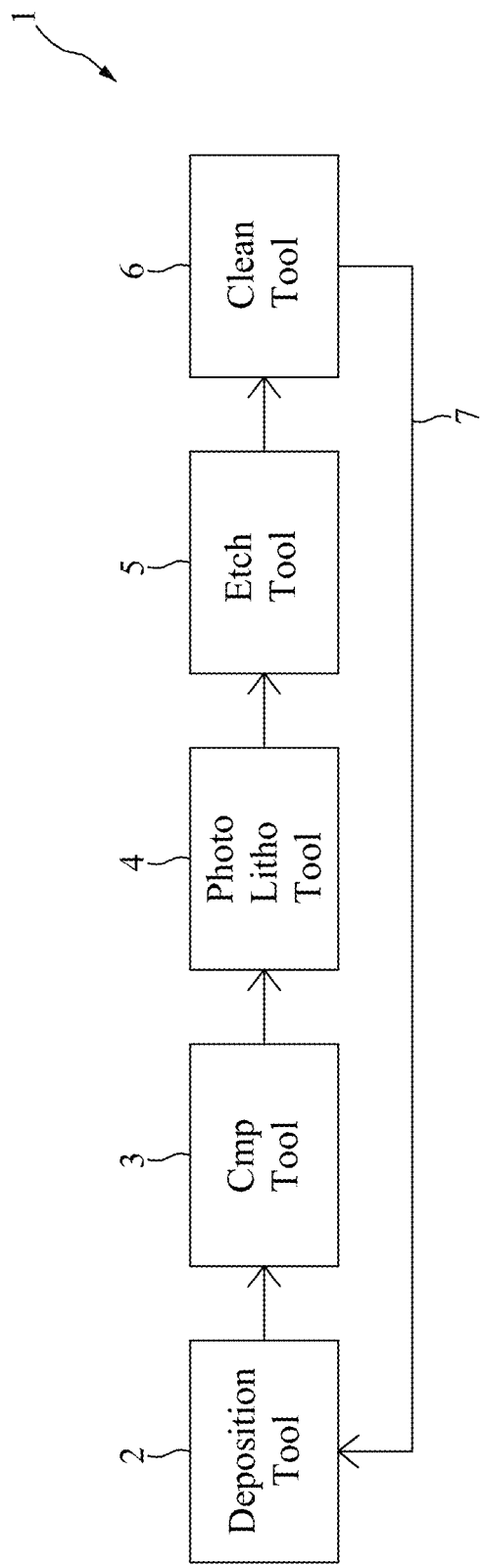
FIG. 1 is a block diagram of a semiconductor fabrication facility according to some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

To describe film-forming or deposition processes, the term "deposition" will generally be used herein for consistency. For film removal, the term "etch" will be used, and for a cleaning removal process, the term "clean" will be used. The figures may use other designations as applicable for illustrative clarity or convenience.

FIG. 1 is a block diagram of a semiconductor fabrication facility 1 according to some embodiments of the present disclosure. With reference to FIG. 1, the semiconductor fabrication facility 1 may include a plurality of semiconductor manufacturing equipment such as a deposition tool 2, a chemical mechanical polishing (CMP) tool 3, a photolithography tool 4, an etch tool 5, and a clean tool. Typically, a design of microelectronic devices to be formed in a wafer is produced, and a layout is made from the design. The layout may include sets of patterns that will be transferred to one or more stacked layers of materials that are applied to the wafer during its fabrication in a process sequence 7 to form the various circuits and devices on the substrate of the wafer. According to some embodiments, the process sequence 7 of the semiconductor fabrication facility 1 shown in FIG. 1 is an exemplary process flow which may be used several times to deposit or form films on a substrate of the wafer and pattern them using a variety of lithography and etch techniques. Such general fabrication steps may include a deposition process using the deposition tool 2, a planarization and/or polishing process using the CMP tool 3, an exposure process with a patterned wavelength of light using the photolithography tool 4, a removal process of the exposed portions of the film using the etch tool 5, and a cleaning process using the clean tool 6 in preparation for subsequent processing. It should be noted that, more steps than deposition, planarization, photolithography, etch, and cleaning may be utilized in the semiconductor fabrication facility 1 as would be understood by a person of ordinary skill in the art. Moreover, each of the steps of a deposition, planarization, photolithography, etch, and clean process may include various specific steps. Therefore, the process sequence 7 depicted in FIG. 1 should not be construed as limiting with respect to embodiments of the present disclosure. In some embodiments, examples of the deposition techniques used in the deposition tool 2 may include chemical vapor deposition (CVD), electrochemical deposition (ECD), physical vapor deposition (PVD), molecular beam epitaxy (MBE), atomic layer deposition (ALD), self-assembled monolayer (SAM) deposition and others. In some embodiments, the deposition techniques may be complemented by the creation of plasma so as to suitably affect the chemical reactivity of the processes occurring at the substrate surface. It should be further noted that, in some embodiments, each of the fabrication tools 2-6 may include semiconductor manufacturing equipment such as at least one front opening unified pod (FOUP) that may be used in conjunction with transfer robots to handle the wafer during the process sequence 7.

Figure 2:
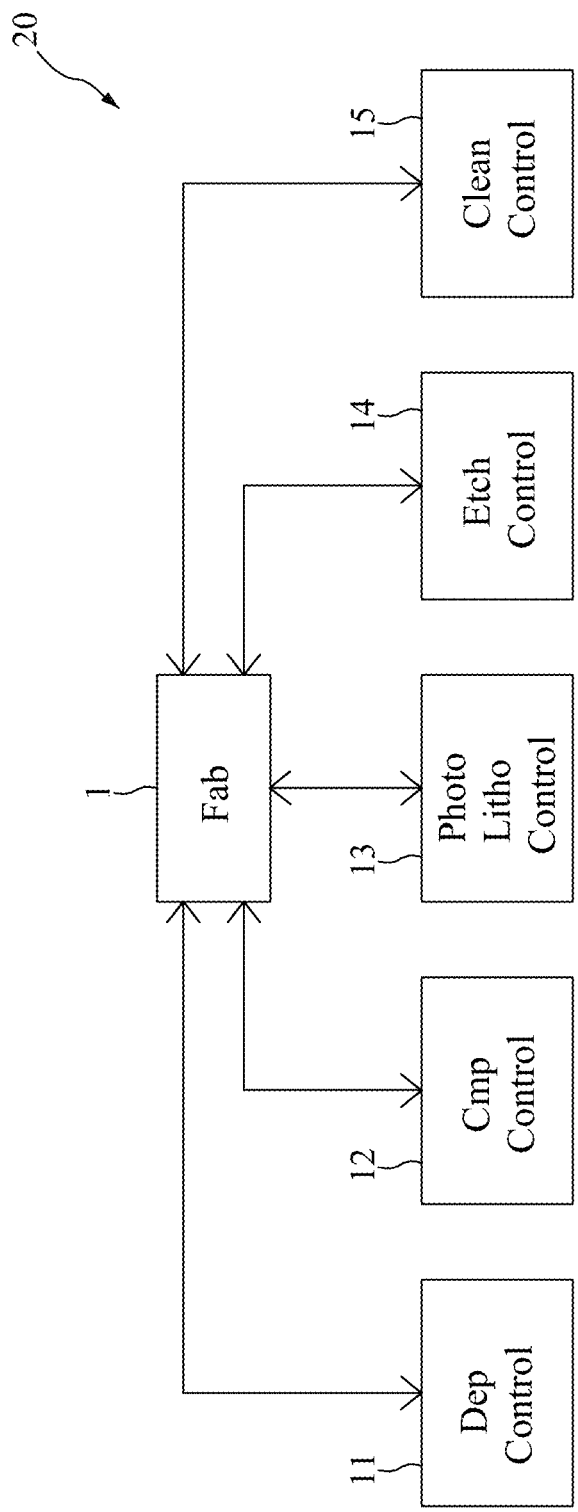
FIG. 2 is a block diagram of a control platform of a semiconductor fabrication facility according to some embodiments of the present disclosure.

FIG. 2 is a block diagram of a control platform 20 of the semiconductor fabrication facility 1 according to some embodiments of the present disclosure. With reference to FIG. 1 and FIG. 2, the control platform 20 includes a plurality of systems for controlling and monitoring the fabrication tools of the semiconductor fabrication facility 1. The control platform 20 may include a system 11 for controlling the deposition tool 2, a system 12 for controlling the CMP tool 3, a system 13 for controlling the photolithography tool 4, a system 14 for controlling the etch tool 5, and a system 15 for controlling the clean tool 6. In some embodiments, as described later in the present disclosure, the control systems 11-15 may include additional systems for controlling the FOUP of the fabrication tools 2-6 in the semiconductor fabrication facility 1. Moreover, pertinent sensor or metrology data may be captured to control and optimize the fabrication processes performed by the fabrication tools of the semiconductor fabrication facility 1. For instance, the systems for controlling the FOUP of the fabrication tools 2-6 may include a plurality of subsystems to control and monitor various parameters and settings in order to optimize the performance of the FOUP in the fabrication tools 2-6 of FIG. 1, as described later in embodiments of the present disclosure.

Figure 3:
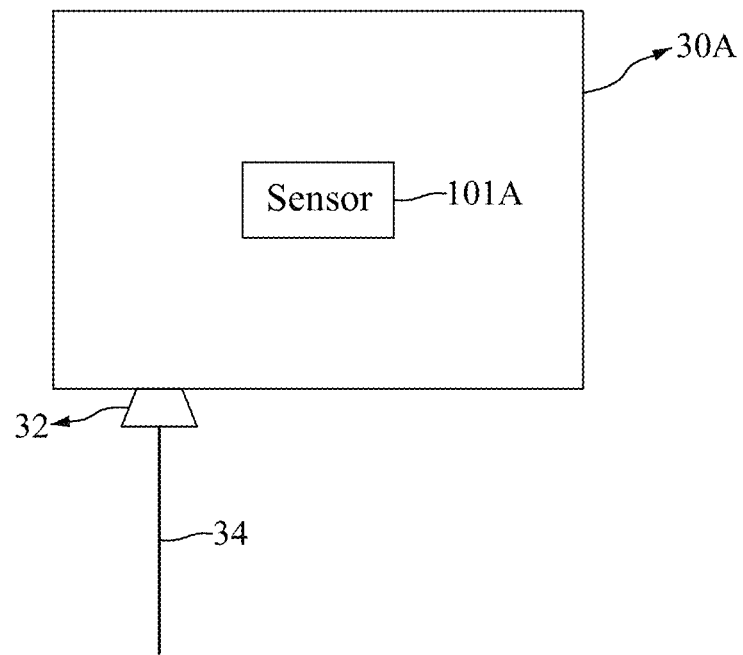
FIG. 3 is a schematic cross-sectional view of a front opening unified pod (FOUP) according to some embodiments of the present disclosure.

FIG. 3 is a schematic cross-sectional view of a FOUP 30A according to some embodiments of the present disclosure. With reference to FIG. 3, the FOUP 30A may include an inlet nozzle 32 and a gas distribution channel 34. In some embodiments, the FOUP 30A may contain a plurality of wafers (not shown) stacked vertically in the FOUP 30A, and the size of FOUP 30A may be adjusted according to the size of the wafers, which may be 200 mm, 300 mm, 450 mm, for example. In some embodiments, the inlet nozzle 32 and the gas distribution channel 34 may be made of plastic, ceramic, rubber, metal, other suitable materials, or combinations thereof. The inlet nozzle 32 and the gas distribution channel 34 may also have Teflon coatings or the like, for example. In some embodiments, to minimize the effects of airborne molecular contamination (AMC), oxygen concentration, and humidity on the wafers inside the FOUP 30A, the FOUP 30A may be filled with a purge gas, such as a high-purity nitrogen gas (N2), through the gas distribution channel 34. The presence of the nitrogen gas may help to reduce AMC and increase a production yield of the wafers carried inside the FOUP 30A. However, poor sealing at a door or other areas in the FOUP 30A may eventually cause leaks and lower the effects of the nitrogen gas. Therefore, controlling and monitoring a gas pressure inside the FOUP 30A remains key to minimize contaminants in the wafers of the FOUP 30A. In some embodiments, a sensor unit 101A may be disposed inside the FOUP 30A to capture a set of data related to the gas pressure inside the FOUP 30A. In some embodiments, the sensor unit 101A may be a pressure detector such as a pressure gauge, a manometer, or the like. Although the sensor unit 101A is depicted as being in a center area of the FOUP 30A, the sensor unit 101A may be placed in any location inside the FOUP 30A best suited to capture pressure data. In some embodiments, when the sensor unit 101A detects that the gas pressure inside the FOUP 30A falls below a threshold level, a malfunction of the FOUP 30A related to the gas pressure may have occurred, such as a leak of the FOUP 30A that contributes to a loss of air tightness in the FOUP 30A. As discussed later in the present disclosure, the set of data related to gas pressure that is captured by the sensor unit 101A may be analyzed by control systems of the FOUP 30A. Accordingly, in some embodiments, the amount of nitrogen gas filling the FOUP 30A may be adjusted in response to the malfunction. For instance, when the malfunction is determined, the control systems may stop the nitrogen gas from flowing into the FOUP 30A through the gas distribution channel 34, so that an operator may service the FOUP 30A and prevent yield loss.

Figure 4:
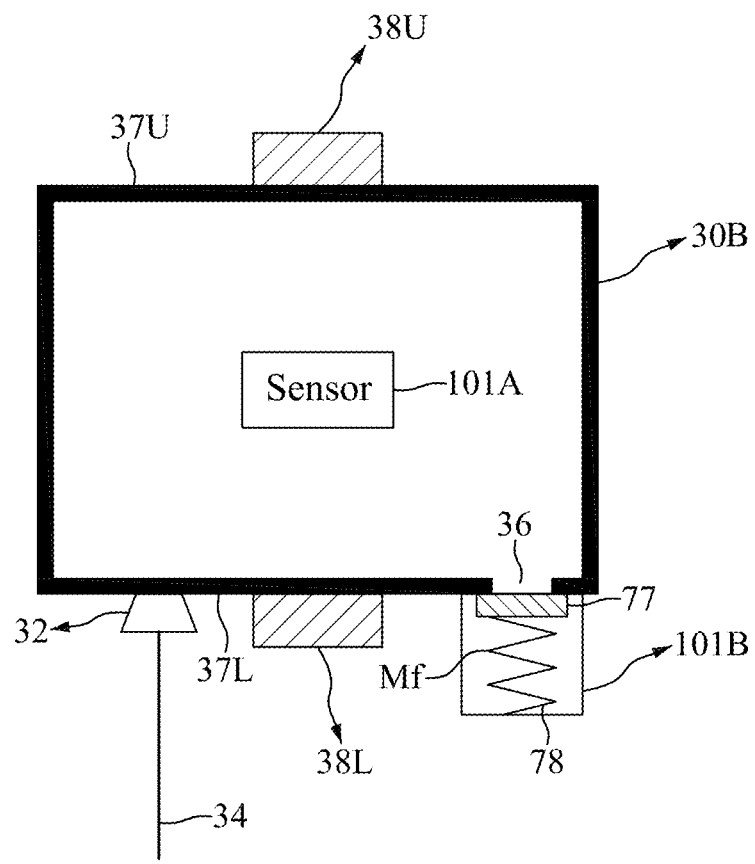
FIG. 4 is a schematic cross-sectional of a FOUP according to some embodiments of the present disclosure.

It should be noted that, the gas pressure inside the FOUP 30A may also be measured by other types of sensor units. FIG. 4 is a schematic cross-sectional view of a FOUP 30B according to some embodiments of the present disclosure. With reference to FIG. 4, in some embodiments, the FOUP 30B depicted in FIG. 4 is similar to the FOUP 30A of FIG. 3 except for the following differences. In some embodiments, a sensor unit 101B is disposed and tightly sealed at a gas outlet 36 of the FOUP 30B. The sensor unit 101B includes a blocking device 77, and a measurable force MF is applied to the blocking device 77. The FOUP 30B may further include an upper fixture 38U disposed on an upper surface 37U of the FOUP 30B, and a lower fixture 38L disposed on a lower surface 37L of the FOUP 30B. The fixtures 38U and 38L may serve to enforce the seal tightness of the inlet nozzle 32 and the blocking device 77. In some embodiments, the measurable force MF may be supplied by a spring device 78, for example. When the FOUP 30B is operating normally, with acceptable gas pressure inside the FOUP 30B, the blocking device 77 is pushed downward from the gas outlet 36 and the spring device 78 is compressed. On the other hand, when a malfunction caused by leaks appears in the FOUP 30B, the gas pressure inside the FOUP 30B may not be sufficient to push off the blocking device 77. In some embodiments, the measurable force MF supplied by the spring device 78 may be determined since the spring device 78 may substantially obey Hooke's law as long as the spring device 78 is not stretched beyond its elastic limit. As stated by Hooke's law, the measurable force MF is linearly proportional to a distance from an equilibrium length of the spring device 78. In some embodiments, the measurable force MF may be measured and recorded by the sensor unit 101B by capturing a set of images with a camera device (not shown) in the sensor unit 101B, for example. The camera device may be a complementary metal-oxide semiconductor (CMOS) camera, a charge-coupled device (CCD) camera, a video camera, or other suitable types of cameras and sensors. As discussed later in the present disclosure, the set of data captured by the sensor unit 101B may also be analyzed by control systems of the FOUP 30B. Accordingly, in some embodiments, the amount of nitrogen gas filling the FOUP 30B may be adjusted in response to the malfunction. For instance, when the malfunction is determined, the control systems may stop the nitrogen gas from flowing into the FOUP 30B through the gas distribution channel 34, so that an operator may service the FOUP 30B and prevent yield loss.

Figure 5:
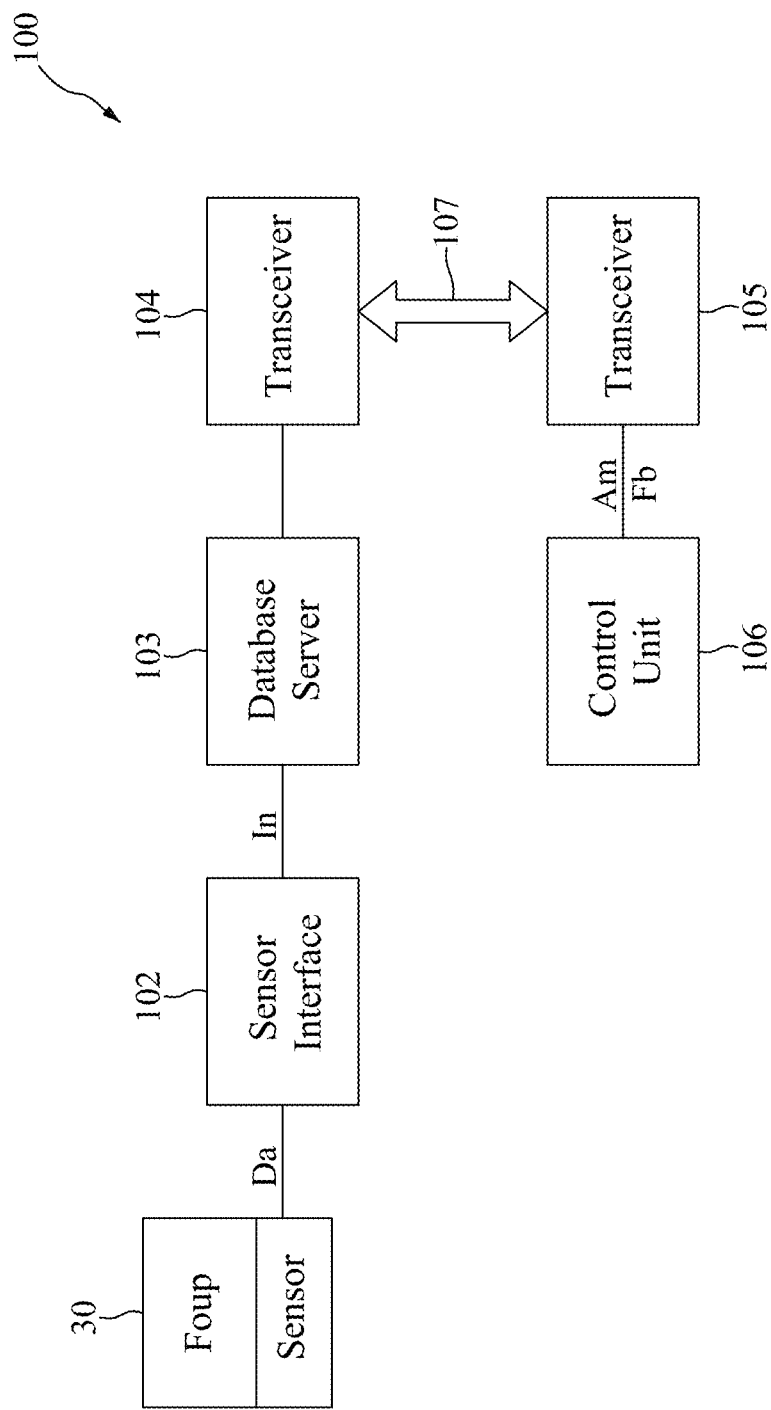
FIG. 5 is a block diagram of a control system of a semiconductor manufacturing equipment according to some embodiments of the present disclosure.
Figure 6:
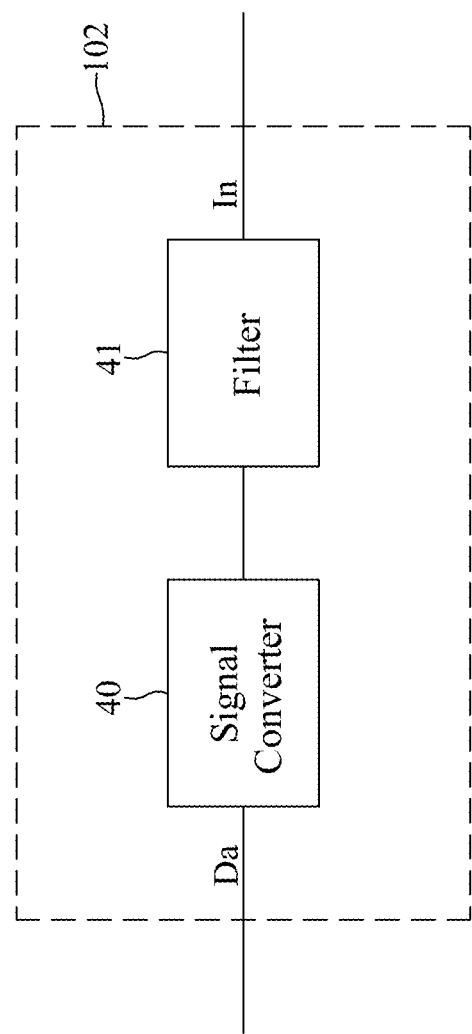
FIG. 6 is a block diagram of a sensor interface according to some embodiments of the present disclosure.
Figure 7:
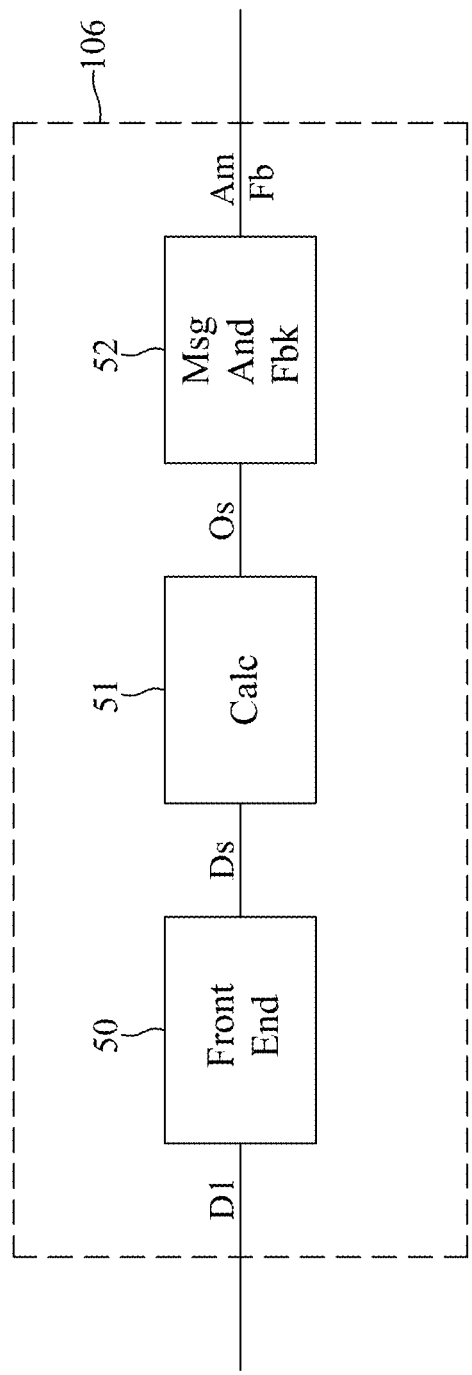
FIG. 7 is a block diagram of a control unit according to some embodiments of the present disclosure.

FIG. 5 is a block diagram of a control system 100 of a semiconductor manufacturing equipment according to some embodiments of the present disclosure. FIG. 6 is a block diagram of a sensor interface 102 according to some embodiments of the present disclosure. FIG. 7 is a block diagram of a control unit 106 according to some embodiments of the present disclosure. With reference to FIG. 5 to FIG. 7, the control system 100 for controlling the semiconductor manufacturing equipment includes s sensor unit 101, the sensor interface 102, a database server 103, a first transceiver 104, a second transceiver 105, and the control unit 106. In some embodiments, the semiconductor manufacturing equipment may include at least one FOUP 30 which may be the FOUP 30A of FIG. 3 or the FOUP 30B of FIG. 4, for example, although the general operating principles of the control system 100 may be applied to other control systems in the control platform 20 of the semiconductor fabrication facility 1. In some embodiments, the sensor unit 101 may include the sensor unit 101A of FIG. 3 or the sensor unit 101B of FIG. 4. The sensor unit 101 may capture a set of data DA related to a gas pressure in the FOUP 30. In some embodiments, the sensor interface 102 receives the set of data DA from the sensor unit 101 and generates at least one input signal IN for the database server 103, which may be a database server of a database warehouse, for example. The input signal IN may be transmitted from the database server 103 by the first transceiver 104 to the second transceiver 105 through a network link 107. In some embodiments, the at least one input signal IN may be modulated when it is transmitted by the first transceiver 104 and demodulated when it is received by the second transceiver 105. The network link 107 may be any suitable type of network link based on wired or wireless technology known in the art, including but not limited to infrared, optical, or radio communication means. In some embodiments, the control unit 106 performs an artificial intelligence (AI) analytical process to determine, according to a data signal DS, whether a malfunction related to the gas pressure has occurred in the FOUP 30 and generate an output signal OS. A feedback signal FB and an alert signal AM are generated according to the output signal OS. In some embodiments, the feedback signal FB from the control unit 106 is transmitted to the FOUP 30 through the network link 107 between the second transceiver 105 and the first transceiver 104. In some embodiments, the feedback signal FB may be modulated when it is transmitted by the second transceiver 105 and demodulated when it is received by the first transceiver 104. In some embodiments, the operation of the FOUP 30 and/or the fabrication tool containing the FOUP 30 may be terminated according to the feedback signal FB.

With reference to FIG. 6, the sensor interface 102 includes one or more signal converters 40 and one or more filters 41. In some embodiments, the signal converters 40 may include analog-to-digital (A/D) converters, digital-to-analog (D/A) converters, image file converters (e.g., image file compression converters), or other suitable signal converters. When generating the input signal IN for the database server 103, the signal converters 40 of the sensor interface 102 may convert the set of data DA to another file format, convert the set of data DA from a uncompressed file to a compressed file, convert the set of DA from one compressed file type to another compressed file type, or perform other suitable types of conversions. The filters 41 may include image filters, anti-alias filters, low-pass filters, high-pass filters, band-pass filters, or other suitable filters for the particular application of the control system 100. The filters 41 may be used to improve the signal to noise ratio of the input signal IN, for instance.

With reference to FIG. 7, the control unit 106 includes a front end subsystem 50, a calculation subsystem 51, and a message and feedback subsystem 52. In some embodiments, the front end subsystem 50 receives the at least one input signal IN from the database server 103 and performs a front end process to generate a data signal DS. The calculation subsystem 51 receives the data signal DS from the front end subsystem 51, and the calculation subsystem 51 performs the AI analytical process to determine, according to the data signal DS, whether a malfunction related to the gas pressure has occurred in the FOUP 30 and to generate an output signal OS. The message and feedback subsystem 52 generates the alert signal AM and the feedback signal FB according to the output signal OS, and the message and feedback subsystem 52 transmits the alert signal AM to a user of the FOUP 30.

Figure 8:
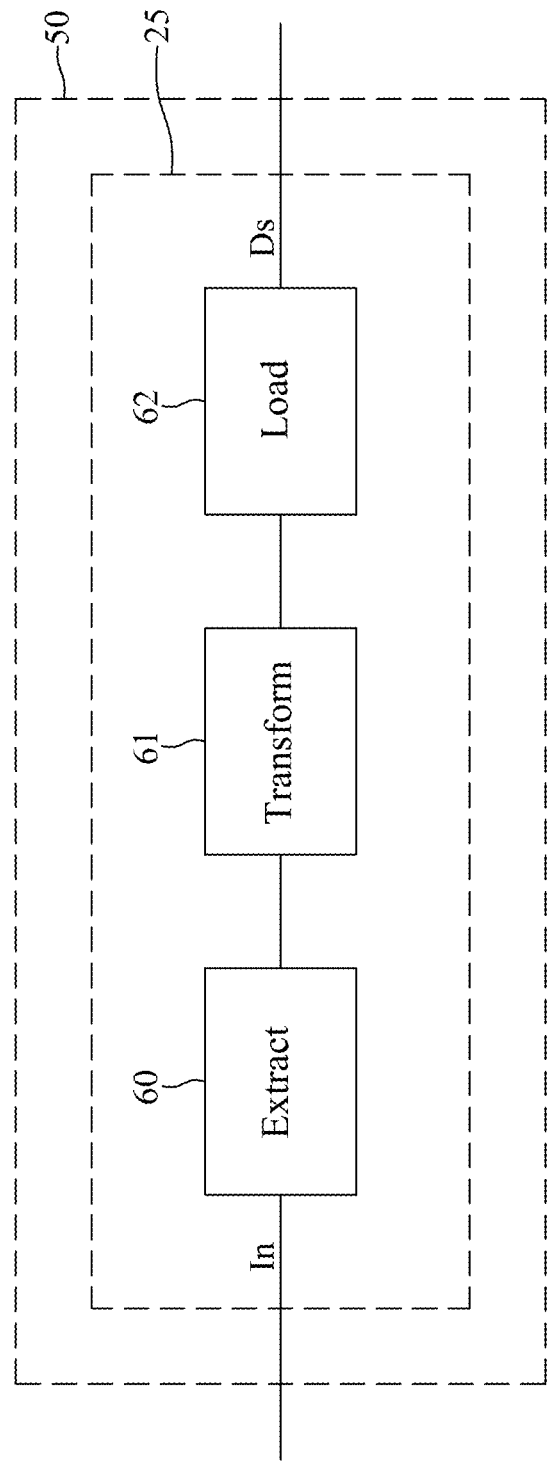
FIG. 8 is a block diagram of a front end subsystem according to some embodiments of the present disclosure.

FIG. 8 is a block diagram of the front end subsystem 50 according to some embodiments of the present disclosure. With reference to FIG. 8, the front end subsystem 50 may include an extract-transform-load (ETL) module 25 for performing the front end process, which may include extracting, transforming, and/or loading the input signal IN from the database server 103. In some embodiments, as shown in FIG. 8, the ETL module 25 includes an extract block 60, a transform block 61, and a load block 62. In some embodiments, the extract block 60 may unpack and extract the at least one input signal IN from the database server 103. The transform block 61 may perform suitable data transformation as well as integrity and confirmation procedures. The load block 62 may generate and load the data signal DS according to the transform process performed by the transform block 61, such that the calculation subsystem 51 is able to use the data signal DS for the AI analytical process.

Figure 9:
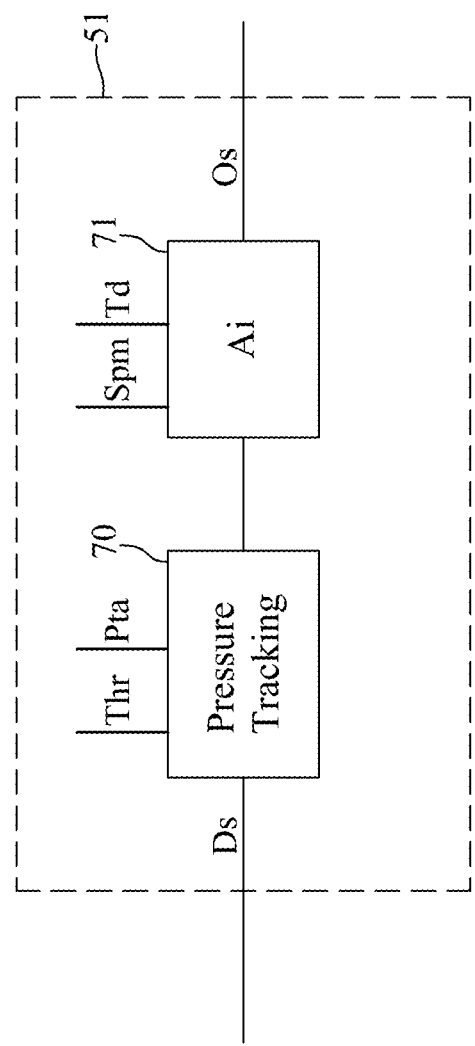
FIG. 9 is a block diagram of a calculation subsystem according to some embodiments of the present disclosure.
Figure 10:
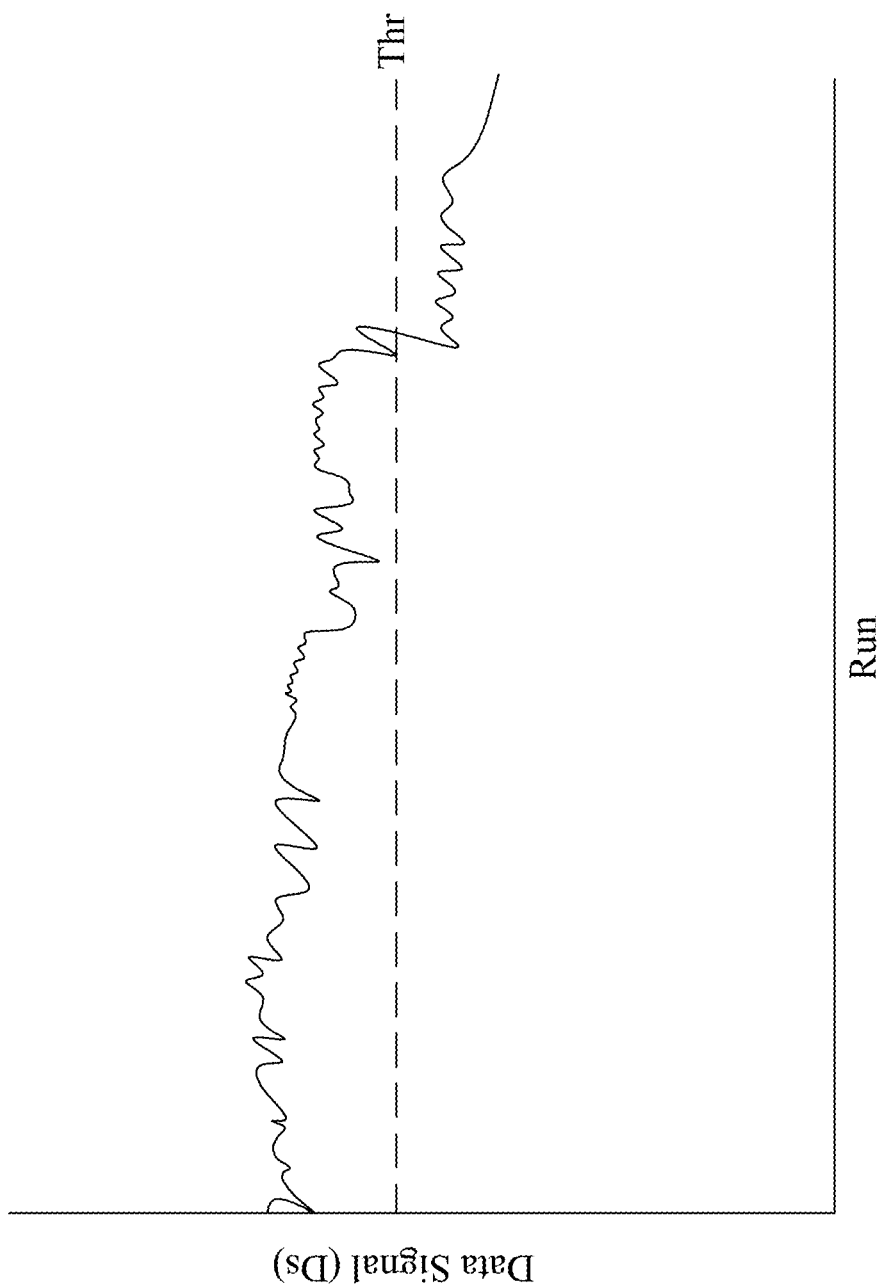
FIG. 10 is a relational diagram comparing a data signal to a threshold level according to some embodiments of the present disclosure.
Figure 11:
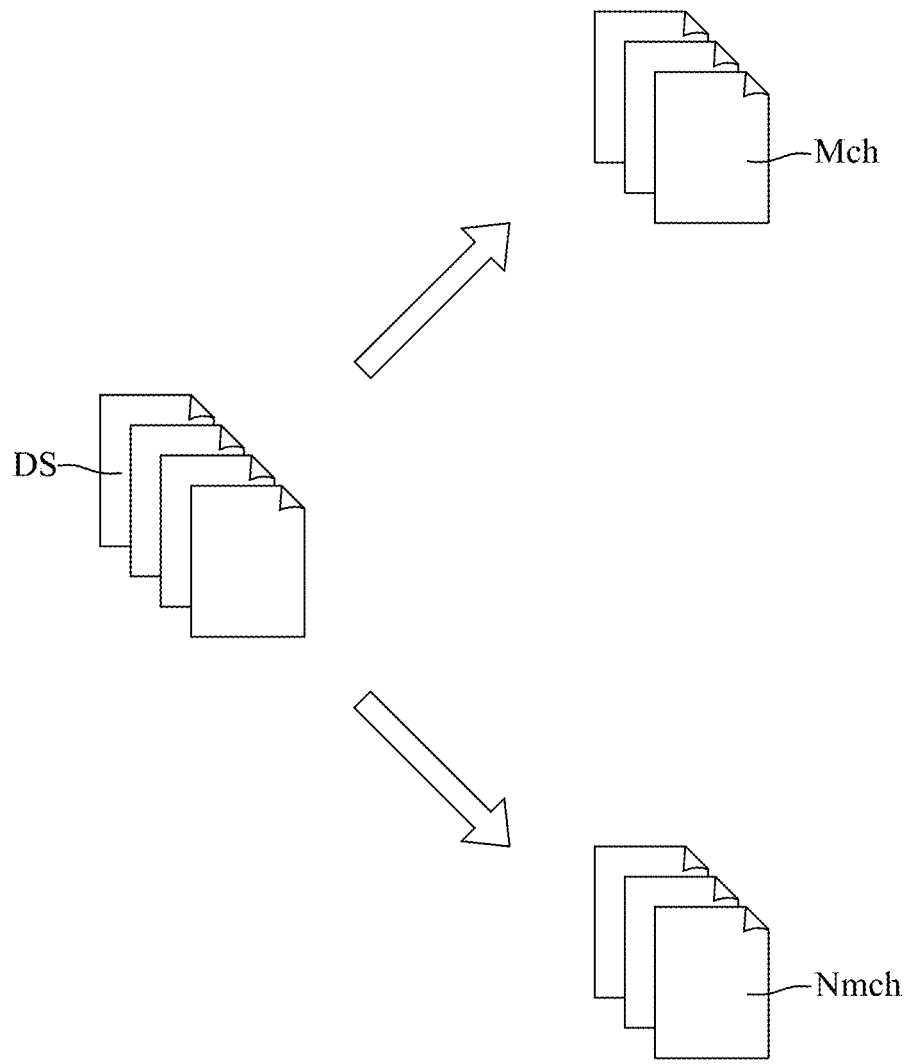
FIG. 11 is a partial schematic view of a categorization process in a statistical prediction model according to some embodiments of the present disclosure.

FIG. 9 is a block diagram of the calculation subsystem 51 according to some embodiments of the present disclosure. FIG. 10 is a relational diagram comparing the data signal DS to a threshold level THR according to some embodiments of the present disclosure. FIG. 11 is a partial schematic view of a categorization process in a statistical prediction model SPM according to some embodiments of the present disclosure. With reference to FIG. 9 to FIG. 11, the calculation subsystem 51 includes a pressure tracking unit 70 and an AI analysis unit 71. In some embodiments, the calculation subsystem 51 performs the AI analytical process to determine, according to the data signal DS, whether a malfunction related to the gas pressure has occurred in the FOUP 30 and to generate the output signal OS. In some embodiments, the AI analytical process performed by the pressure tracking unit 70 of the calculation subsystem 51 compares the set of data DA related to the gas pressure in the data signal DS to the threshold level THR to determine whether the malfunction related to gas pressure has occurred in the FOUP 30. As shown in FIG. 10, in this example relational diagram, the data signal DS is compared to the threshold level THR, which may be a predetermined threshold level based on the size of the FOUP 30 and the type of purge gas and sensor unit used, for example. When the gas pressure represented in the data signal DS falls below the threshold level THR, seal leaks may have occurred which may cause the FOUP 30 lose its air tightness and lead to airborne molecular contamination of the wafers. In some embodiments, the AI analytical process performed by the pressure tracking unit 70 of the calculation subsystem 51 further utilizes a pressure tracking algorithm PTA to monitor the gas pressure in the FOUP 30 and determine whether a seal is maintained. The pressure tracking algorithm PTA utilized by the pressure tracking unit 70 may be adjusted according to the type of sensor unit 101 used to measure the gas pressure inside the FOUP 30. For example, the pressure tracking algorithm PTA for the sensor unit 101B of the FOUP 30B of FIG. 4 may be based on the amount of displacement of the spring device 78 and the measurable force MF exerted on the blocking device 77 in the sensor unit 101B. In some embodiments, the AI analytical process performed by the AI analysis unit 71 of the calculation subsystem 51 utilizes a statistical prediction model SPM corresponding to the data signal DS to predict when a failure and contamination time beings for the FOUP 30. As shown in FIG. 11, the AI analysis unit 71 of the calculation subsystem 51 may perform a categorization and weighting process in the statistical prediction model SPM. In some embodiments, the AI analysis unit 71 may identify, categorize, and weight the data signal DS into a match group MCH and a non-match group NMCH depending on a predetermined criteria, such as whether the data signal DS represents the gas pressure inside the FOUP 30 is lower than the threshold level THR, for example. In some embodiments, the statistical prediction model SPM may be formed by using a set of training data TD with previously captured data on the gas pressure inside the FOUP 30. In some embodiments, the statistical prediction model SPM may be a deep learning statistical model based on neural networks, for example, although other suitable artificial intelligence approaches may be used, such as deep learning models based on pseudo neural networks. Accordingly, in some embodiments, the output signal OS generated by the calculation subsystem 51 may contain data such as the identity of the malfunctioning FOUP 30, the gas pressure inside the FOUP 30 when the malfunction occurs, the predicted failure and contamination time of the FOUP 30, as well as other pertinent data that may be requested by the user of the FOUP 30.

Figure 12:
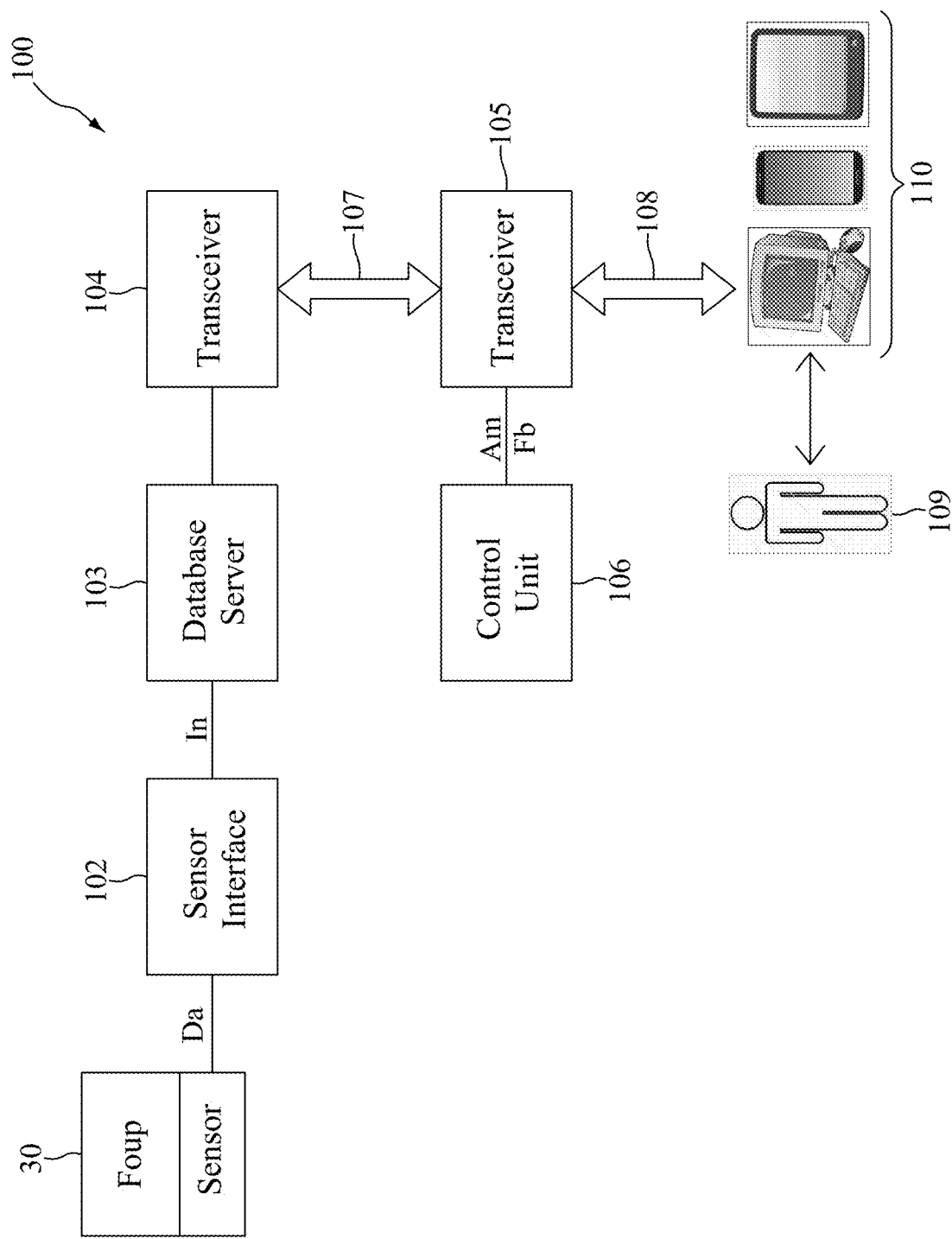
FIG. 12 is a block diagram depicting a control system of a semiconductor manufacturing equipment and a user thereof according to some embodiments of the present disclosure.
Figure 13:
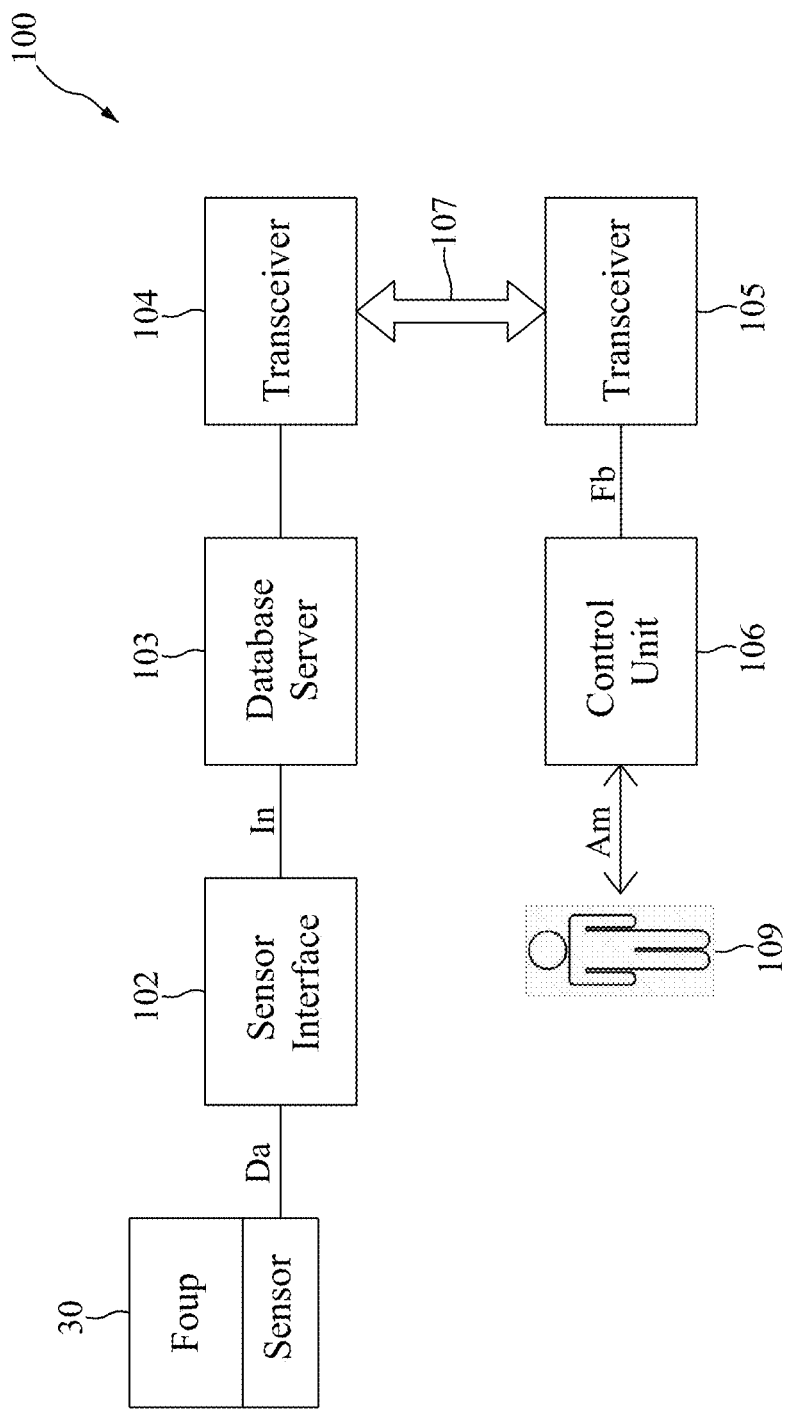
FIG. 13 is a block diagram depicting a control system of a semiconductor manufacturing equipment and a user thereof according to some embodiments of the present disclosure.
Figure 14A:
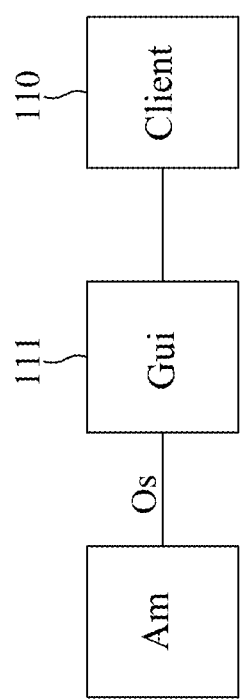
FIG. 14A is a relational diagram showing a relationship between an alert signal and components thereof according to some embodiments of the present disclosure.
Figure 14B:
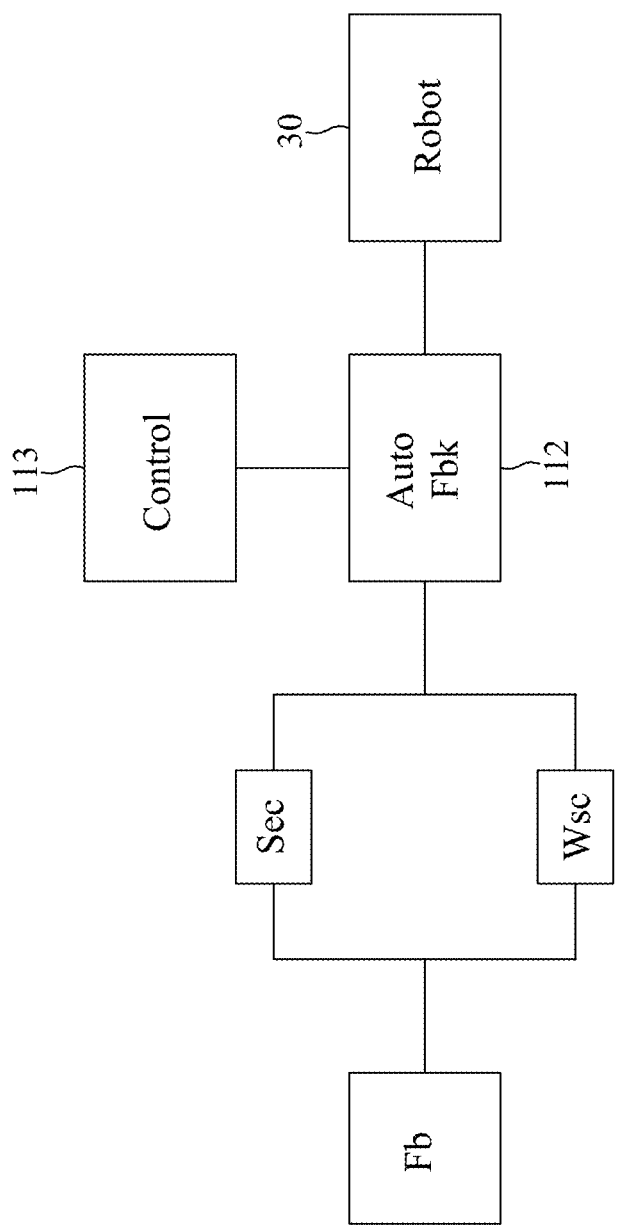
FIG. 14B is a relational diagram showing a relationship between a feedback signal and components thereof according to some embodiments of the present disclosure.

In some embodiments, the message and feedback subsystem 52 generates the alert signal AM according to the output signal OS from the calculation subsystem 51. In some embodiments, the alert signal AM may be sent to a user of the FOUP 30. FIG. 12 and FIG. 13 are block diagrams depicting the control system 100 of the semiconductor manufacturing equipment and a user 109 thereof according to some embodiments of the present disclosure. FIG. 14A is a block diagram showing a relationship between an alert signal AM and components thereof according to some embodiments of the present disclosure. FIG. 14B is a block diagram showing a relationship between a feedback signal FB and components thereof according to some embodiments of the present disclosure. With reference to FIGS. 12 and 13, in some embodiments, the message and feedback subsystem 52 may transmit the alert signal AM to the user 109 through a network link 108 established between the second transceiver 105 and a client system 110. As shown in FIG. 12, the client system 110 may be, for example, a desktop computer, a notebook computer, a smart phone, a tablet computer, or the like capable of displaying the alert signal AM to the user 108. With reference to FIG. 14A, the contents of the alert signal AM, which may include data included in the output signal OS, may be presented in a graphical user interface (GUI) 111 on the client system 110. The network link 108 may be any suitable type of network link based on wired or wireless technology known in the art, including but not limited to infrared, optical, or radio communication means. The alert signal AM may be transmitted to the client system 110 via electronic mail, instant messaging applications, or the like. The network links 107 and 108 may be part of a same network or different networks. The network links 107 and 108 may be part of an intranet, an extranet, an ad hoc network, a virtual private network (VPN), a local area network (LAN), a wireless LAN (WLAN), a wireless WAN (WWAN), a wide area network (WAN), a metropolitan area network (MAN), a portion of the Internet, a portion of the Public Switched Telephone Network (PSTN), a cellular telephone network, or a combination of two or more of these. In some embodiments, as shown in FIG. 13, the alert signal AM may also be directly supplied and displayed by the control unit 106 to the user 109. In some embodiments, the alert signal AM gives the user 109 advanced warnings regarding the status of the FOUP 30, such as when failure and contamination in the FOUP 30 would begin to occur, and whether automated feedback processes are scheduled.

With reference to FIG. 14B, in some embodiments, when the feedback signal FB is transmitted to the FOUP 30 for an automated feedback process 112, the FOUP 30 may be shutdown according to the output signal OS, and the FOUP 30 may also be automatically adjusted (e.g., adjusting the inlet nitrogen gas pressure). In some embodiments, as shown in FIG. 14B, the feedback signal FB may include a stop equipment command SEC, and/or a wafer scrap command WSC according to the output signal OS. In some embodiments, the feedback signal FB may also include other commands such as alignment adjustment commands, gas power adjustment commands, power adjustment commands, or other process feedback commands. In some embodiments, the FOUP 30 may be shutdown and/or adjusted run-to-run with reference to the feedback signal FB. It should be noted that, the feedback signal FB may be used directly by the FOUP 30 for the automated feedback process 112, or the feedback signal FB may be transmitted to a separate controller 113 to control the automated feedback process 112 of the FOUP 30.

Figure 15:
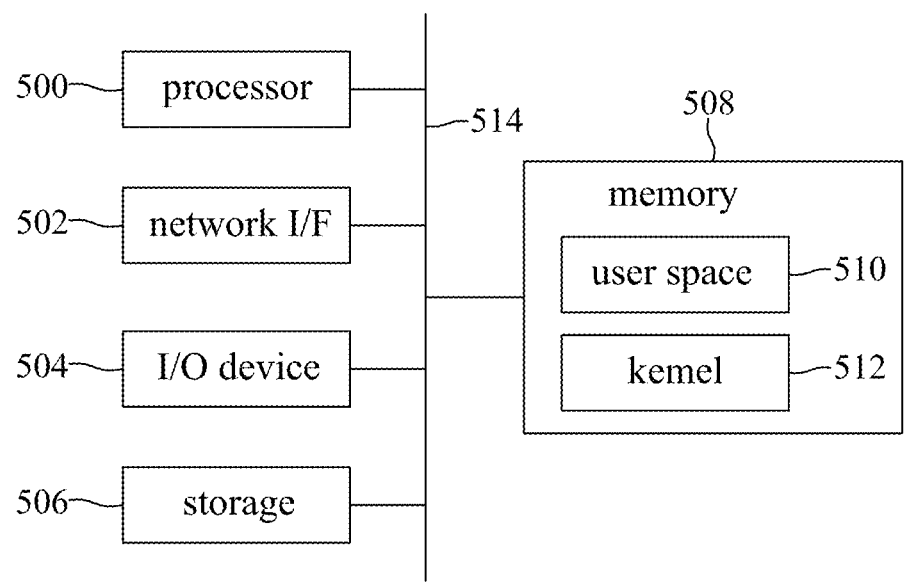
FIG. 15 is a block diagram of a computer system according to some embodiments of the present disclosure.

It should be noted that one or more of the tools, subsystems, methods, or operations described in the present disclosure may be realized by a computer system including instructions operable when executed by one or more processors of the computer system. For example, the control unit 106 and a method 600 described later in the present disclosure may be implemented by a computer system depicted in FIG. 15. FIG. 15 is a block diagram of a computer system 80 according to some embodiments of the present disclosure. With reference to FIG. 15, the computer system 80 may include one or more processors 500, a network interface (I/F) 502, a storage device 506, a memory 508, and an input/output (I/O) device 504 communicatively coupled via a bus 514 or other interconnection communication mechanism. The memory 508 includes, in some embodiments, a random access memory (RAM), other dynamic storage device, read-only memory (ROM), or other static storage device, coupled to the bus 514 for storing data or instructions to be executed by the one or more processors 500, and the memory 508 may include a kernel 512, a user space 510, portions of the kernel or the user space, and components thereof. The memory 508 is also used, in some embodiments, for storing temporary variables or other intermediate information during execution of instructions to be executed by the one or more processors 500.

In some embodiments, the storage device 506 is coupled to the bus 514 for transferring data or instructions to, for example, the kernel 512, the user space 510, etc. In some embodiments, the operations and functionalities are realized as functions of a program stored in the storage device 506, which may include one or more computer-readable non-transitory storage media coupled to the one or more processors 500. Examples of the computer-readable non-transitory storage media include, but are not limited to, external/ removable or internal/built-in storage or memory unit, e.g., one or more of an optical disk, such as a DVD, a magnetic disk, such as a hard disk, a semiconductor memory, such as a ROM, a RAM, a memory card, and the like. In some embodiments, the computer-readable non-transitory storage media of the storage device 506 includes instructions operable when executed by the one or more processors 500 to cause the control system 100 to receive the at least one input signal IN from the database server 103 and perform the front end process to generate the data signal DS; receive the data signal DS and perform the AI analytical process to determine, according to the data signal DS, whether a malfunction related to the gas pressure has occurred in the semiconductor manufacturing equipment and to generate the output signal OS; and generate the alert signal AM and the feedback signal FB according to the output signal OS, and transmit the alert signal AM to the user 109 of the semiconductor manufacturing equipment.

In some embodiments, the one or more computer-readable non-transitory storage media further includes instructions operable when executed by the one or more processors 500 to cause the control system 100 to perform the AI analytical process by comparing the set of data DA related to the gas pressure in the data signal DS to the threshold level THR to determine whether the malfunction has occurred in the semiconductor manufacturing equipment. In some embodiments, the one or more computer-readable non-transitory storage media further includes instructions operable when executed by the one or more processors 500 to cause the control system 100 to perform the AI analytical process by further utilizing the pressure tracking algorithm PTA to monitor the gas pressure in the semiconductor manufacturing equipment and determine whether a seal is maintained. In some embodiments, the one or more computer-readable non-transitory storage media further includes instructions operable when executed by the one or more processors 500 to cause the control system 100 to perform the AI analytical process by further utilizing the statistical prediction model SPM corresponding to the data signal DS to predict a failure and contamination time of the semiconductor manufacturing equipment. In some embodiments, the front end process includes extracting, transforming, and/or loading the input signal IN from the database server 103. In some embodiments, the one or more computer-readable non-transitory storage media further includes instructions operable when executed by the one or more processors 500 to cause the control system 100 to transmit the feedback signal FB for the automated feedback process 112 of the semiconductor manufacturing equipment according to the output signal OS. In some embodiments, the semiconductor manufacturing equipment includes at least one front opening unified pod (FOUP), and the sensor unit 101 comprises at least one pressure detector disposed in the FOUP. In some embodiments, the semiconductor manufacturing equipment includes at least one FOUP, and the sensor unit 101 includes at least one blocking device 77 disposed at the gas outlet 36 of the FOUP, wherein the measurable force MF is applied to the blocking device 77.

In some embodiments, the I/O device 604 includes an input device, an output device, or a combined input/output device for enabling user interaction with the control unit 106. An input device includes, for example, a keyboard, keypad, mouse, trackball, trackpad, or cursor direction keys for communicating information and commands to the processor 500. An output device includes, for example, a display, a printer, a voice synthesizer, etc. for communicating information to a user. In some embodiments, one or more operations or functionalities of the tools, subsystems, and methods described in the present disclosure are realized by the one or more processors 500 of the computer system 80, which is programmed for performing such operations and functionalities. One or more of the memory 508, the network I/F 502, the storage device 506, the I/O device 504, and the bus 514 are operable to receive instructions, data, design rules, netlists, layouts, models and other parameters for processing by the processor 500. In some embodiments, one or more of the operations and functionalities of the tools, subsystems, and methods described in the present disclosure may be implemented by specifically configured hardware (e.g., by one or more application specific integrated circuits (ASICs)) separate from or in lieu of the processor 500. Some embodiments incorporate more than one of the described operations or functionality in a single ASIC.

Figure 16:
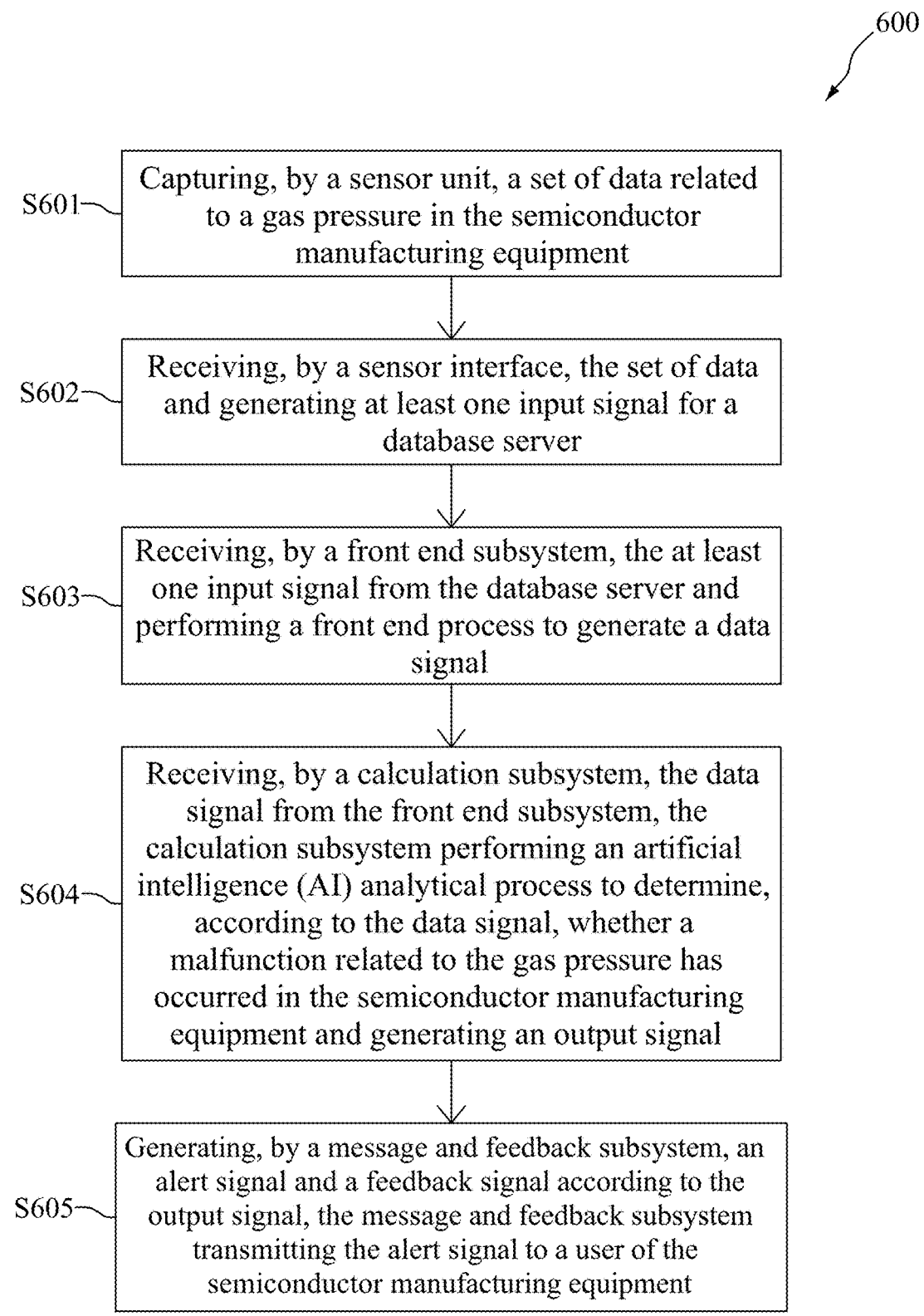
FIG. 16 is a flow diagram of a method for controlling a semiconductor manufacturing equipment according to some embodiments of the present disclosure.

FIG. 16 is a flow diagram of a method 600 for controlling a semiconductor manufacturing equipment according to some embodiments of the present disclosure. In some embodiments, the method 600 may be implemented by the control system 100 depicted in FIG. 5 to FIG. 9, and the method 600 may also be realized by the computer system 80 depicted in FIG. 15. With reference to FIG. 16, the method 600 for controlling the semiconductor manufacturing equipment includes: capturing, by the sensor unit 101, the set of data DA related to the gas pressure in the semiconductor manufacturing equipment (Step S601); receiving, by the sensor interface 102, the set of data DA and generating the at least one input IN signal for the database server 103 (Step S602); receiving, by the front end subsystem 50, the at least one input signal IN from the database server 103 and performing the front end process to generate the data signal DS (Step S603); receiving, by the calculation subsystem 51, the data signal DS from the front end subsystem 50, the calculation subsystem 51 performing the artificial intelligence (AI) analytical process to determine, according to the data signal DS, whether a malfunction related to the gas pressure has occurred in the semiconductor manufacturing equipment and generating the output signal OS (Step S604); and generating, by the message and feedback subsystem 52, the alert signal AM and the feedback signal FB according to the output signal OS, the message and feedback subsystem 52 transmitting the alert signal AM to the user 109 of the semiconductor manufacturing equipment (Step S605).

Figure 17:
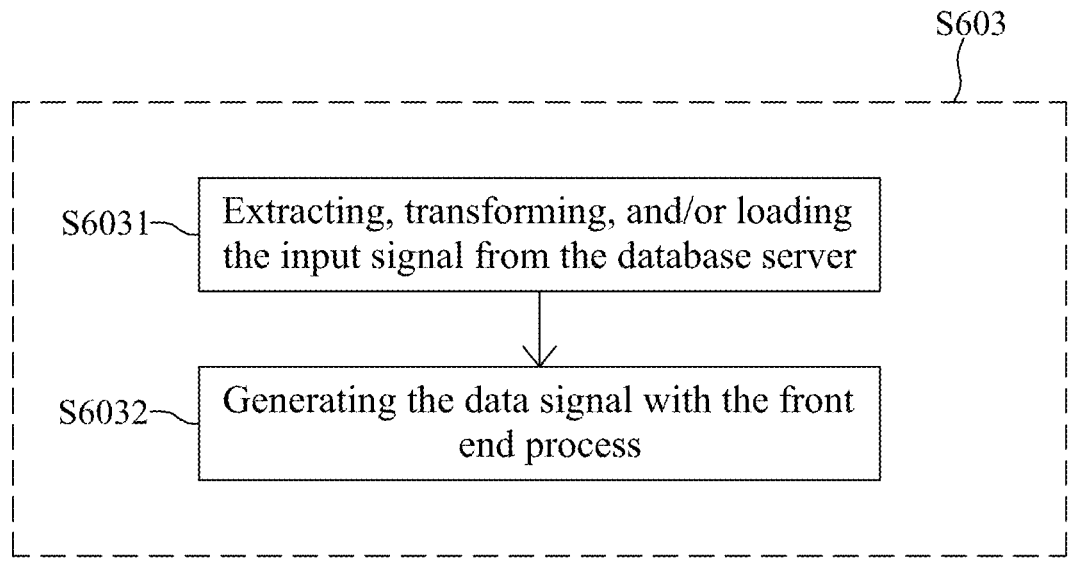
FIG. 17 is a flow diagram of a step in a method for controlling a semiconductor manufacturing equipment according to some embodiments of the present disclosure.

FIG. 17 is a flow diagram of the Step S603 in the method 600 according to some embodiments of the disclosure. In some embodiments, the front end process performed by the front end subsystem 50 further includes extracting, transforming, and/or loading the input signal IN from the database server 103 (Step S6031); and generating the data signal DS with the front end process (Step S6032).

Figure 18:
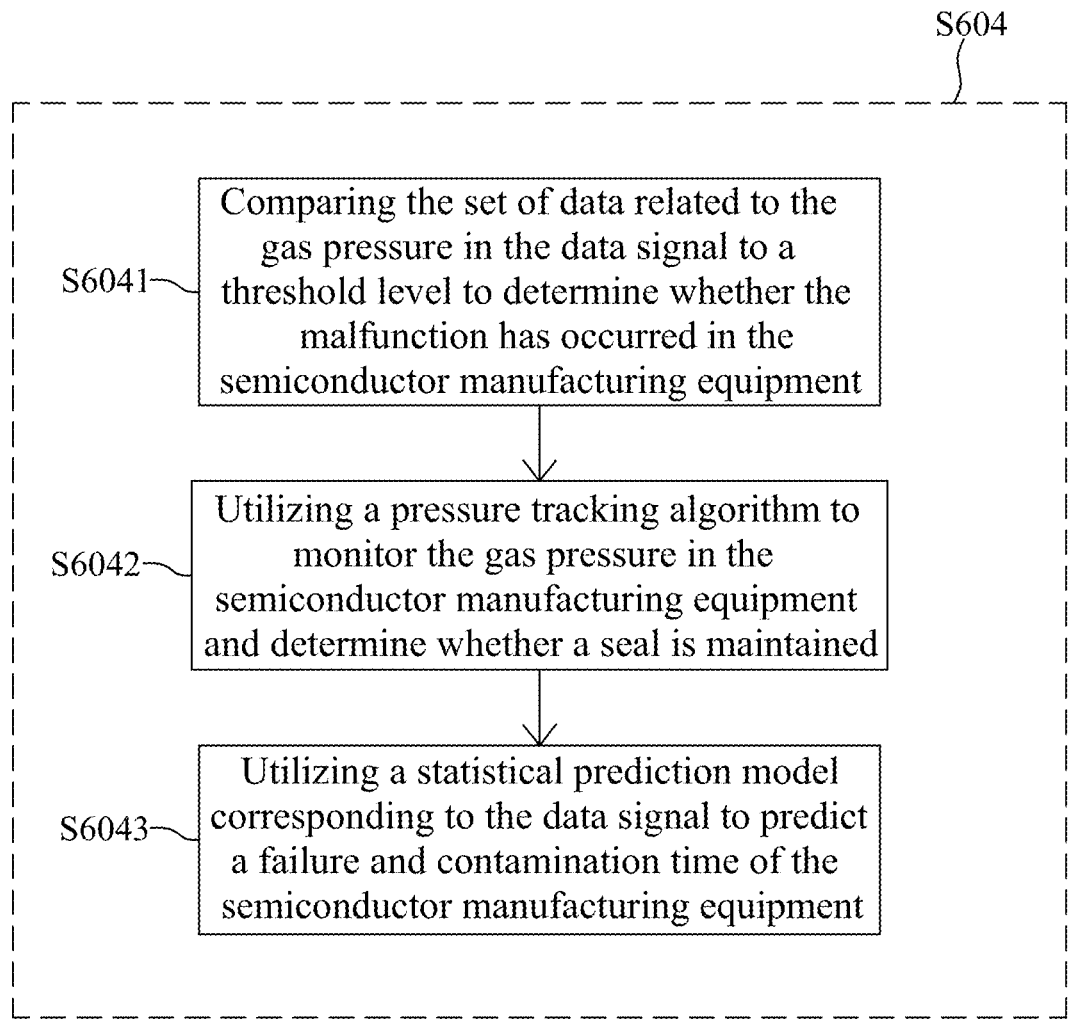
FIG. 18 is a flow diagram of a step in a method for controlling a semiconductor manufacturing equipment according to some embodiments of the present disclosure.

FIG. 18 is a flow diagram of the Step S604 in the method 600 according to some embodiments of the disclosure. In some embodiments, the AI analytical process performed by the calculation subsystem 51 further includes comparing the set of data DA related to the gas pressure in the data signal DS to the threshold level THR to determine whether the malfunction has occurred in the semiconductor manufacturing equipment (Step S6041). In some embodiments, the AI analytical process performed by the calculation subsystem 51 further includes utilizing the pressure tracking algorithm PTA to monitor the gas pressure in the semiconductor manufacturing equipment and determine whether a seal is maintained (Step S6042). In some embodiments, the AI analytical process performed by the calculation subsystem 51 further includes utilizing the statistical prediction model SPM corresponding to the data signal DS to predict a failure and contamination time of the semiconductor manufacturing equipment (Step S6043).

Figure 19:
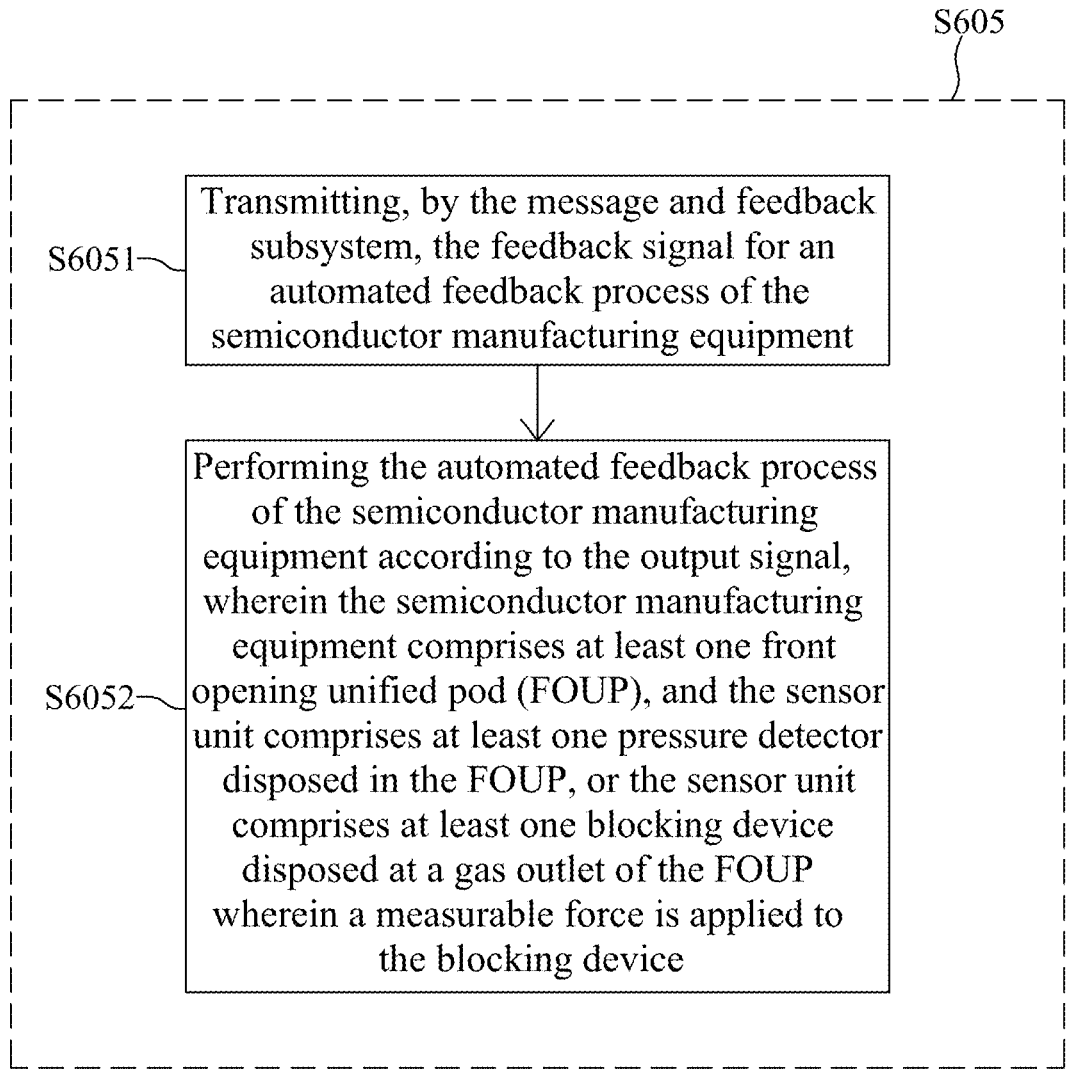
FIG. 19 is a flow diagram of a step in a method for controlling a semiconductor manufacturing equipment according to some embodiments of the present disclosure.

FIG. 19 is a flow diagram of the Step S605 in the method 600 according to some embodiments of the disclosure. In some embodiments, the method 600 further includes transmitting, by the message and feedback subsystem 52, the feedback signal FB for the automated feedback process 112 of the semiconductor manufacturing equipment (Step S6051); and performing the automated feedback process 112 according to the output signal OS, wherein the semiconductor manufacturing equipment includes at least one front opening unified pod (FOUP) 30, and the sensor unit 101 includes at least one pressure detector 101A disposed in the FOUP 30 (Step S6052), or the sensor unit 101 includes at least one blocking device 77 disposed at the gas outlet 36 of the FOUP 30 wherein the measurable force MF is applied to the blocking device 77 (Step S6052).

Accordingly, the control system 100 and the method 600 for controlling the semiconductor manufacturing equipment provide automated AI subsystems and processes capable of analyzing the gas pressure in equipment such as the FOUP 30, where seal leaks may lead to airborne molecular contamination of the wafers. Due to the control unit 106, which includes the intelligent calculation subsystem 51 and the message and feedback subsystem 52, operators of the FOUP 30 can monitor and optimize the gas pressure related parameters and receive advanced warnings regarding malfunctioning equipment. Moreover, due to the automated equipment feedback of the control system 100 and the method 600, human judgment error, processing times, and production yield loss can be minimized.

One aspect of the present disclosure provides a control system of a semiconductor manufacturing equipment, comprising a sensor unit capturing a set of data related to a gas pressure in the semiconductor manufacturing equipment, a sensor interface receiving the set of data and generating at least one input signal for a database server, and a control unit. The control unit comprises a front end subsystem, a calculation subsystem, and a message and feedback subsystem. The front end subsystem receives the at least one input signal from the database server and performs a front end process to generate a data signal. The calculation subsystem receives the data signal from the front end subsystem, wherein the calculation subsystem performs an artificial intelligence (AI) analytical process to determine, according to the data signal, whether a malfunction related to the gas pressure has occurred in the semiconductor manufacturing equipment and generate an output signal. The message and feedback subsystem generates an alert signal and a feedback signal according to the output signal, the message and feedback subsystem transmitting the alert signal to a user of the semiconductor manufacturing equipment.

Another aspect of the present disclosure provides a control system of a semiconductor manufacturing equipment comprising a sensor unit capturing a set of data related to a gas pressure in the semiconductor manufacturing equipment, a sensor interface receiving the set of data and generating at least one input signal for a database server, one or more processors, and one or more computer-readable non-transitory storage media. The one or more computer-readable non-transitory storage media is coupled to the one or more processors and includes instructions operable when executed by the one or more processors to cause the control system to: receive the at least one input signal from the database server and perform a front end process to generate a data signal; perform an artificial intelligence (AI) analytical process to determine, according to the data signal, whether a malfunction related to the gas pressure has occurred in the semiconductor manufacturing equipment and generate an output signal; and generate an alert signal and a feedback signal according to the output signal, and transmit the alert signal to a user of the semiconductor manufacturing equipment.

Another aspect of the present disclosure provides a method for controlling a semiconductor manufacturing equipment comprising: capturing, by a sensor unit, a set of data related to a gas pressure in the semiconductor manufacturing equipment; receiving, by a sensor interface, the set of data and generating at least one input signal for a database server; receiving, by a front end subsystem, the at least one input signal from the database server and performing a front end process to generate a data signal; receiving, by a calculation subsystem, the data signal from the front end subsystem, the calculation subsystem performing an artificial intelligence (AI) analytical process to determine, according to the data signal, whether a malfunction related to the gas pressure has occurred in the semiconductor manufacturing equipment and generate an output signal; and generating, by a message and feedback subsystem, an alert signal and a feedback signal according to the output signal, the message and feedback subsystem transmitting the alert signal to a user of the semiconductor manufacturing equipment.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A control system of a semiconductor manufacturing equipment, comprising:
    a sensor unit capturing a set of data related to a gas pressure in the semiconductor manufacturing equipment;
    a sensor interface receiving the set of data and generating at least one input signal for a database server; and
    a control unit comprising:
        a front end subsystem receiving the at least one input signal from the database server and performing a front end process to generate a data signal;
        a calculation subsystem receiving the data signal from the front end subsystem, wherein the calculation subsystem performs an artificial intelligence (AI) analytical process to determine, according to the data signal, whether a malfunction related to the gas pressure has occurred in the semiconductor manufacturing equipment and generate an output signal; wherein the AI analytical process performed by the calculation subsystem utilizes a statistical prediction model corresponding to the data signal to predict a failure and contamination time of the semiconductor manufacturing equipment, and the statistical prediction model is formed by using a set of training data with previously captured data on the gas pressure in the semiconductor manufacturing equipment wherein the statistical prediction model includes a categorization and weighting process performed by the AI analysis unit to identify, categorize and weight the data signal into a match group and a non-match group depending on a comparison between the data signal representing the gas pressure inside the semiconductor manufacturing equipment and a threshold level; and
        a message and feedback subsystem generating an alert signal and a feedback signal according to the output signal, the message and feedback subsystem transmitting the alert signal to a user of the semiconductor manufacturing equipment.

2. The control system of claim 1, wherein the AI analytical process performed by the calculation subsystem compares the set of data related to the gas pressure in the data signal to the threshold level to determine whether the malfunction has occurred in the semiconductor manufacturing equipment.

3. The control system of claim 2, wherein the AI analytical process performed by the calculation subsystem further utilizes a pressure tracking algorithm to monitor the gas pressure in the semiconductor manufacturing equipment and determine whether a seal is maintained.

4. The control system of claim 1, wherein the front end process performed by the front end subsystem comprises extracting, transforming, and/or loading the input signal from the database server, and the message and feedback subsystem transmits the feedback signal for an automated feedback process of the semiconductor manufacturing equipment according to the output signal.

5. The control system of claim 4, wherein the semiconductor manufacturing equipment comprises at least one front opening unified pod (FOUP), and the sensor unit comprises at least one pressure detector disposed in the FOUP.

6. The control system of claim 4, wherein the semiconductor manufacturing equipment comprises at least one front opening unified pod (FOUP), and the sensor unit comprises at least one blocking device disposed at a gas outlet of the FOUP, wherein a measurable force is applied to the blocking device.

7. A control system of a semiconductor manufacturing equipment comprising:
   a sensor unit capturing a set of data related to a gas pressure in the semiconductor manufacturing equipment;
   a sensor interface receiving the set of data and generating at least one input signal for a database server;
   one or more processors; and
   one or more computer-readable non-transitory storage media coupled to the one or more processors and comprising instructions operable when executed by the one or more processors to cause the control system to:
      receive the at least one input signal from the database server and perform a front end process to generate a data signal;
      receive the data signal and perform an artificial intelligence (AI) analytical process to determine, according to the data signal, whether a malfunction related to the gas pressure has occurred in the semiconductor manufacturing equipment and generate an output signal;
      perform the AI analytical process by utilizing a statistical prediction model corresponding to the data signal to predict a failure and contamination time of the semiconductor manufacturing equipment, wherein the statistical prediction model is formed by using a set of training data with previously captured data on the gas pressure in the semiconductor manufacturing equipment;
      perform a categorization and weighting process in the statistical prediction model to identify, categorize and weight the data signal into a match group and a non-match group depending on a comparison between the data signal representing the gas pressure inside the semiconductor manufacturing equipment and a threshold level; and
      generate an alert signal and a feedback signal according to the output signal, and transmit the alert signal to a user of the semiconductor manufacturing equipment.

8. The control system of claim 7, the one or more computer-readable non-transitory storage media further comprising instructions operable when executed by the one or more processors to cause the control system to perform the AI analytical process by comparing the set of data related to the gas pressure in the data signal to the threshold level to determine whether the malfunction has occurred in the semiconductor manufacturing equipment.

9. The control system of claim 7, the one or more computer-readable non-transitory storage media further comprising instructions operable when executed by the one or more processors to cause the control system to perform the AI analytical process by further utilizing a pressure tracking algorithm to monitor the gas pressure in the semiconductor manufacturing equipment and determine whether a seal is maintained.

10. The control system of claim 7, wherein the front end process comprises extracting, transforming, and/or loading the input signal from the database server, and the one or more computer-readable non-transitory storage media further comprising instructions operable when executed by the one or more processors to cause the control system to transmit the feedback signal for an automated feedback process of the semiconductor manufacturing equipment according to the output signal.

11. The control system of claim 10, wherein the semiconductor manufacturing equipment comprises at least one front opening unified pod (FOUP), and the sensor unit comprises at least one pressure detector disposed in the FOUP.

12. The control system of claim 10, wherein the semiconductor manufacturing equipment comprises at least one front opening unified pod (FOUP), and the sensor unit comprises at least one blocking device disposed at a gas outlet of the FOUP, wherein a measurable force is applied to the blocking device.

13. A method for controlling a semiconductor manufacturing equipment comprising:
   capturing, by a sensor unit, a set of data related to a gas pressure in the semiconductor manufacturing equipment;
   receiving, by a sensor interface, the set of data and generating at least one input signal for a database server;
   receiving, by a front end subsystem, the at least one input signal from the database server and performing a front end process to generate a data signal;
   receiving, by a calculation subsystem, the data signal from the front end subsystem, the calculation subsystem performing an artificial intelligence (AI) analytical process to determine, according to the data signal, whether a malfunction related to the gas pressure has occurred in the semiconductor manufacturing equipment and generating an output signal; wherein the AI analytical process performed by the calculation subsystem further comprises utilizing a statistical prediction model corresponding to the data signal to predict a failure and contamination time of the semiconductor manufacturing equipment, wherein the statistical prediction model is formed by using a set of training data with previously captured data on the gas pressure in the semiconductor manufacturing equipment;
   performing, by the calculation subsystem, a categorization and weighting process in the statistical prediction model to identify, categorize and weight the data signal into a match group and a non-match group depending on a comparison between the data signal representing the gas pressure inside the semiconductor manufacturing equipment and a threshold level; and generating, by a message and feedback subsystem, an alert signal and a feedback signal according to the output signal, the message and feedback subsystem transmitting the alert signal to a user of the semiconductor manufacturing equipment.

14. The method of claim 13, the AI analytical process performed by the calculation subsystem further comprising comparing the set of data related to the gas pressure in the data signal to the threshold level to determine whether the malfunction has occurred in the semiconductor manufacturing equipment, and utilizing a pressure tracking algorithm to monitor the gas pressure in the semiconductor manufacturing equipment and determine whether a seal is maintained.

15. The method of claim 13, wherein the front end process performed by the front end subsystem further comprises extracting, transforming, and/or loading the input signal from the database server, the method further comprising transmitting, by the message and feedback subsystem, the feedback signal for an automated feedback process of the semiconductor manufacturing equipment according to the output signal.

16. The method of claim 15, wherein the semiconductor manufacturing equipment comprises at least one front opening unified pod (FOUP), and the sensor unit comprises at least one pressure detector disposed in the FOUP.

17. The method of claim 15, wherein the semiconductor manufacturing equipment comprises at least one front opening unified pod (FOUP), and the sensor unit comprises at least one blocking device disposed at a gas outlet of the FOUP, wherein a measurable force is applied to the blocking device.

* * * * *